(12) United States Patent
De Huu et al.

(10) Patent No.: US 8,179,124 B2
(45) Date of Patent: May 15, 2012

(54) INDUCTIVE PROXIMITY SENSOR FOR EMBEDDED MOUNTING AND METHOD OF DESIGN

(75) Inventors: Marc De Huu, Murist (CH); Peter Heimlicher, Fribourg (CH); Charles Rhême, Posieux (CH); Philippe Venier, La Corbaz (CH)

(73) Assignee: Optosys SA (CH)

( * ) Notice: Subject to any disclaimer, the term of this patent is extended or adjusted under 35 U.S.C. 154(b) by 503 days.

(21) Appl. No.: 12/499,923

(22) Filed: Jul. 9, 2009

(65) Prior Publication Data
US 2010/0013464 A1 Jan. 21, 2010

(30) Foreign Application Priority Data
Jul. 15, 2008 (EP) .................................... 08405180

(51) Int. Cl.
*G01R 33/00* (2006.01)
(52) U.S. Cl. .............. 324/207.11; 324/200; 324/207.13; 324/207.23
(58) Field of Classification Search .................. None
See application file for complete search history.

(56) References Cited

U.S. PATENT DOCUMENTS

| | | | |
|---|---|---|---|
| 7,394,243 B2 * | 7/2008 | Tsuchida et al. ......... | 324/207.15 |
| 2011/0254544 A1 * | 10/2011 | Vogl et al. ..................... | 324/229 |

FOREIGN PATENT DOCUMENTS

| | | |
|---|---|---|
| DE | 34 38 998 | 4/1986 |
| DE | 103 41 113 | 5/2004 |
| EP | 1 372 173 | 12/2003 |

OTHER PUBLICATIONS

European Search Report mailed Jan. 19, 2009 in corresponding European Patent Application No. EP 08 40 5180.
Koibuchi et al., "Characteristic Analysis and Enhancement of Sensing Property for Eddy-Current Type Proximity Sensor", *IEICE Transaction Electronics*, vol. E88-C, No. 8, Aug. 2005, The Institute of Electronics, Information and Communication Engineers, pp. 1696-1703.

* cited by examiner

*Primary Examiner* — Jermele M Hollington
*Assistant Examiner* — Trung Nguyen
(74) *Attorney, Agent, or Firm* — Ostrolenk Faber LLP

(57) ABSTRACT

The invention relates to an inductive proximity sensor for embedding in a mild steel mounting plate, comprising an enclosure with a front wall of synthetic material forming a sensing face at a front end of the enclosure, an oscillator comprising a sensor coil with a core made of a material with a relative magnetic permeability larger than 1, typically a ferrite, which is arranged within the enclosure behind the front wall so that an open side of the core is directed towards the sensing face in order to direct the magnetic field of the coil towards a target in front of the sensing face, a hollow cylindrical metal member arranged perpendicular to the sensing face and surrounding the core, and a measuring circuit for measuring an attenuation of the oscillator due to eddy currents. The core is radially surrounded by a metal layer with a low electrical resistivity of less than 15 $\mu\Omega\cdot\text{cm}$ and with a thickness of less than 40 $\mu\text{m}$, in order to improve the embeddability of the sensor. Alternatively, this thin metal layer may be omitted, if the electrical resistivity of the metal member is adjusted to a value in the range of 15 $\mu\Omega\cdot\text{cm}$–50 $\mu\Omega\cdot\text{cm}$.

16 Claims, 3 Drawing Sheets

INDUCTIVE PROXIMITY SENSOR FOR EMBEDDED MOUNTING AND METHOD OF DESIGN

BACKGROUND OF THE INVENTION

The invention relates to an inductive proximity sensor for embedding in a metal mounting plate and a method of designing the same.

The proximity sensors comprise an RLC oscillator with a sensor coil, the magnetic field of which generates eddy currents in a target. The power loss caused by these eddy currents represents a load which increasingly attenuates the oscillator as the distance between the sensor and the target is reduced.

The measure for the rate at which an oscillator dissipates its stored energy is the quality factor Q, which is $2\pi$ times the ratio of the energy stored to the energy dissipated per cycle. The maximal quality factor $Q_{max}$ of the oscillating system of an inductive proximity sensor is measured in the sensor's non-embedded state and in absence of the target. In operation, the quality factor Q depreciates due to eddy current losses in the mounting plate and/or in a target. Normalizing the quality factor Q to the maximal quality factor $Q_{max}$, a relative quality factor $Q_{rel}$ is defined as follows:

$$Q_{rel} = \frac{Q}{Q_{max}} \quad (1)$$

If no field-influencing bodies are present in the environment of the sensor, Q is equal to $Q_{max}$ and therefore $Q_{rel}$ is equal to 1. What was mentioned with respect to the quality factor Q before, applies to the relative quality factor $Q_{rel}$ as well: it depreciates due to the fact that the energy dissipation per cycle is increased by eddy current losses in the mounting plate and/or the target. The amount of this depreciation is the measure for the attenuation of the oscillator:

$$\text{Attenuation} = 1 - Q_{rel} = \frac{Q_{max} - Q}{Q_{max}} \quad (2)$$

The sensor circuit comprises a measuring circuit arranged to generate an output signal, which is a function of this attenuation.

A distinction is made between switching and analog inductive proximity sensors. The measuring circuit of a proximity switch is arranged to switch the output signal from one state to another as soon as the attenuation reaches a reference threshold, which is also called operating threshold in this context, whereas the measuring circuit of an analog proximity sensor is arranged to generate an output signal which, for attenuations exceeding a reference threshold, is a monotonic function of the oscillator attenuation.

The outer surface of an enclosure of the sensor comprises a sensing face to which the magnetic field of the sensor coil is directed by means of a core. The target distance is the distance from this sensing face to the target and the range of the sensor is the value to which this target distance needs to be reduced (by approaching the target to the sensing face) to produce a change of the sensor's output signal. The sensor range thus defined is called operating distance if the sensor is a proximity switch. The range specified in the data sheet of a sensor is called the rated range. The actual range of a sensor may deviate from its rated range due to manufacturing tolerances, for instance.

As a basis for the measurement and the specification of the sensor range, the international standard IEC 60947-5-2 defines the size and material of the target to be used. The standard target is a square mild steel plate with a thickness of 1 mm and a side length which is equal to either the diameter of the sensing face or three times the rated range of the sensor, whichever is greater.

The range of an inductive proximity sensor and its embeddability are conversely related. The greater the target distance, the smaller are the eddy current losses in the target, resulting in an increased impact of eddy current losses in the mounting plate on the total amount of eddy current losses which is determining for the oscillator attenuation.

To increase the range of a sensor, its reference threshold is reduced. In the following table, the rated operating distance of embeddable proximity switches as specified in the standard IEC 60947-5-2, which is attainable with a reference threshold of approximately 35 percent, is compared to the measured operating distance of correspondingly sized state of the art proximity switches characterized by a reference threshold of only 10 percent:

TABLE 1

| Sensor size | Operating distance | |
|---|---|---|
| | IEC Standard | 10% threshold |
| M5 | — | 1.2 mm |
| M8 | 1 mm | 2.2 mm |
| M12 | 2 mm | 3.7 mm |
| M18 | 5 mm | 6.5 mm |
| M30 | 10 mm | 13.0 mm |

In this table, the size of the sensors is specified by the diameter of an externally threaded sleeve forming the enclosure of the sensors.

A long range proximity sensor is characterized by a reference threshold of 10 percent or less. By reducing the reference threshold below 10 percent, sensors with an even longer range can be realized. Long range sensors with a reference threshold of less than 5 percent are known in the art. Based on the values in the right column of the above table, the minimal range $S_{min}$ of a long range sensor can be approximately determined using the formula $$S_{min} = 0.14 + 0.114 * d^{1.4} \quad (3)$$

wherein d is the outer diameter of the sensor's enclosure sleeve in millimeters and $S_{min}$ is the sensor range in millimeters.

Ordinary long range sensors are not fully embeddable in a steel mounting plate because the attenuation caused by the mounting plate in the embedded state almost coincides with or exceeds the reference threshold of the sensor, rendering in particular any switching type proximity sensor inoperable.

To mitigate the influence of the mounting plate, the use of a shield skirt surrounding the coil and the core in order to prevent the sensor field from reaching the mounting plate is suggested in the German patent application DE 3438998 A1. A metal layer designed to act as a shield against an alternating magnetic field is at least as thick as the skin depth of the layer material at the field's oscillation frequency and preferably thicker. The skin depth of a material can be calculated as $$\text{skin depth} = \sqrt{\frac{\rho}{\pi \cdot f \cdot \mu_0 \cdot \mu_r}} \qquad (4)$$

where

ρ is the resistivity of the material in [Ω·m],
f is the angular frequency of the field in [Hz],
$\mu_0$ is the permeability of free space in [N/A²] and
$\mu_r$ is the relative magnetic permeability of the material.

For instance, the skin depth of copper at a frequency of 1 MHz is 66 µm. The operating frequency of sensors with a sensor coil having a core is preferably above 50 kHz in order to reach a long operating distance, but it is generally below 1 MHz and therefore a copper layer surrounding the core must be even thicker in order to act as a shield.

SUMMARY OF THE INVENTION

It is an object of the present invention to improve the embeddability of proximity sensors without adversely affecting their sensor range.

This object is achieved by an embeddable proximity sensor and a method of designing such a sensor.

BRIEF DESCRIPTION OF THE DRAWINGS

The invention is described in detail hereafter in conjunction with preferred embodiments represented in the appended drawings.

DETAILED DESCRIPTION OF THE INVENTION

Figure 1:
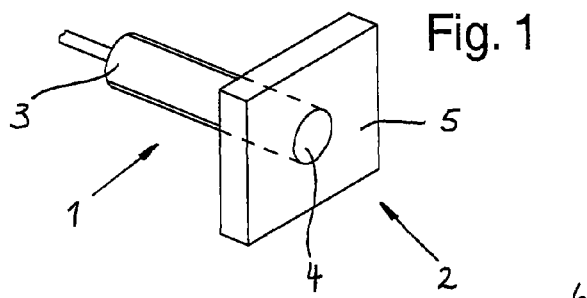
FIG. 1 shows in perspective view an inductive proximity sensor mounted flush in a mounting plate.

FIG. 1 shows an inductive proximity sensor 1 mounted in a mounting plate 2. The enclosure of the sensor substantially consists of a cylindrical sleeve 3 made of non-ferromagnetic metal, which is threaded on its outside and screwed into a correspondingly threaded through-bore of the mounting plate 2, so that a sensing face 4 of the enclosure, which is perpendicular to the sleeve axis, is flush with a front surface 5 of the mounting plate 2. The term flush mounted is used as a synonym for embedded hereinafter and implies that the bore through the mounting plate is not enlarged near the front surface 5 of the mounting plate, so that no space is provided around a front portion of the sensor 1.

Figure 2:
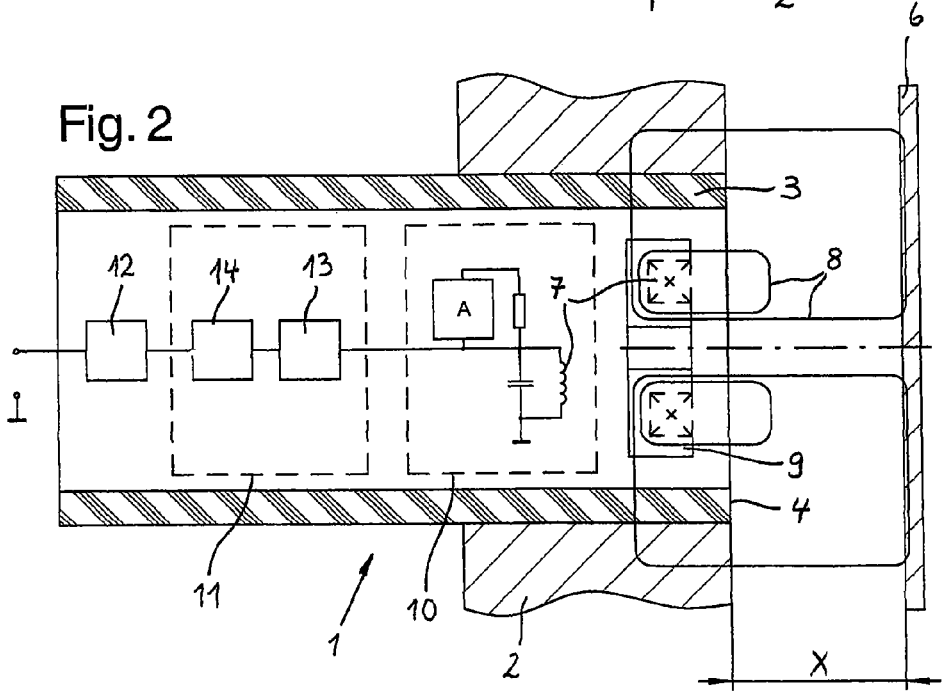
FIG. 2 shows a schematic representation of an arrangement comprising a sensor mounted in a mounting plate according to FIG. 1 and a target in front of the sensor.

FIG. 2 is a schematic representation of an arrangement comprising an inductive proximity switch 1 mounted in a mounting plate 2 according to FIG. 1 and a target plate 6 arranged in front of its sensing face 4. The sensor has an electrical circuit and a magnetic circuit, which are represented separately. The electrical circuit with the sensor coil 7 is shown as a block diagram, while the magnetic circuit is represented by magnetic field lines 8 and different bodies of material exposed to the magnetic field, namely an open pot core 9 of the sensor coil 7, an enclosure sleeve 3 radially surrounding this core 9, the mounting plate 2 and the target 6. These bodies are shown in sectional view in a cutting plane through the middle of the sleeve 3, which is cylindrical and of circular cross-section. The electrical circuit and the magnetic circuit are linked by the sensor coil 7.

The electrical circuit, also called sensor circuit, comprises an RLC oscillator 10, the inductive component L of which is formed by the sensor coil 7 and the core 9 of this coil. The core 9 consists of a material with a relative magnetic permeability larger than 1, typically a ferrite. The magnetic field of the sensor coil generates eddy currents in the target 6 and the power loss caused by these eddy currents represents a load which increasingly attenuates the oscillator 10 as the distance between the sensing face 4 and the target 6, which is referred to as the target distance x, is reduced.

The sensor circuit further comprises a measuring circuit 11 and an output circuit 12. The measuring circuit 11 is designed to measure the oscillator attenuation based on an electric quantity which is a monotonic function of this attenuation. Depending on the electronic design of the oscillator, this quantity may be the amplitude of the oscillator or the output current of a feedback amplifier of the oscillator, for instance. The measuring circuit comprises a signal transforming unit 14, which may be preceded by a rectifier 13. The signal transforming unit 14 of a proximity switch is a comparator arranged to compare the attenuation with a predetermined reference threshold which is also called operating threshold in this context. In opposition to this, the signal transforming unit 14 of an analog proximity sensor has a transfer function designed to generate an output signal of the measuring circuit which is a linear function of the target distance x for values between zero and the distance at which the attenuation corresponds to the reference threshold.

The output signal of the signal transforming unit 14 is conditioned by the output circuit 12 in order to form an output signal of the sensor which is made available at the outside of the enclosure by means of a signal conduct.

The target distance x at which a standard size target as defined above attenuates the oscillator to the predetermined reference threshold defines the range of the sensor. The range of a sensor of the switching type is also called operating distance.

Figure 3:
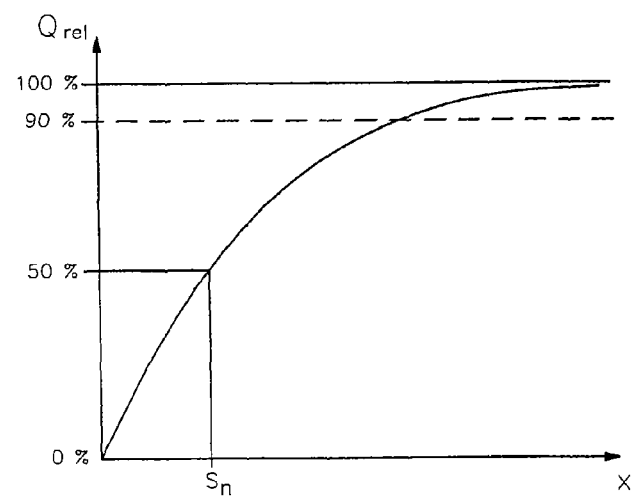
FIG. 3 shows a graph of the relative quality factor $Q_{rel}$ of the oscillator of a sensor as shown in FIG. 2, as a function of the target distance x.

FIG. 3 shows the graph of the relative oscillator attenuation $Q_{rel}$ as a function of the target distance. The reference threshold of a long range sensor is above the 90% line. At this operating point the curve is rather flat, so that even a minor attenuation caused by the mounting plate has a significant impact on the sensor range. Nevertheless the design of a long range proximity sensor embeddable in a metal mounting plate (usually a mild steel mounting plate) is possible because the geometry and the electrical resistivity of the conducting elements which radially surround the core of the sensor coil can be adapted in such a way that the range of the sensor embedded in the mounting plate is aligned with the range of the non-embedded sensor (the range of the same sensor without the mounting plate).

The greater the precision of this alignment, the better is the embeddability of the sensor. For an inductive proximity sensor to be considered embeddable, its range in the embedded state must not differ from its range in the non-embedded state significantly. A difference of more than 30 percent between the former and the latter is considered significant. Preferably, this difference does not exceed 20 percent and more preferably this difference does not exceed 10 percent.

A conducting element may form part of the enclosure or be arranged within the enclosure. Usually one of the conducting elements surrounding the core of the sensor coil is a metal sleeve 3 of the enclosure. Further elements may include metal layers applied to the inner and/or the outer surface of such a sleeve or one or more elements which are radially interposed between the core and the sleeve.

Elements radially surrounding the core are elements which are outside of the core in the radial direction and which are close to the core in the axial direction, so that they are at least partly exposed to the magnetic field of the sensor coil in the embedded and/or the non-embedded state of the sensor. This includes elements which, in the axial direction, are partly or entirely in front of the core, because the core directs the magnetic field towards the front end of the enclosure. Conversely, the geometry of a rear portion of the sleeve 3, which is not exposed to the magnetic field and does not conduct eddy currents, has no influence on eddy current losses in the sensor-target arrangement. It is therefore sufficient if a front portion of the sleeve, representing a hollow cylindrical metal member surrounding the core, is taken into consideration as an electrically conducting element surrounding the core. As a general rule, anything situated behind the rear end of the core in the axial direction, may be ignored.

All the conducting elements surrounding the core are radially thinner than the skin depth of their respective material at the operating frequency of the oscillator, so that they do not act as a shield. If the radial thickness of a conducting element is not constant, this rule applies for the thinnest point of such an element. For instance, the thickness of an externally threaded enclosure sleeve is its thickness at the deepest point of the thread in this context.

Figure 4:
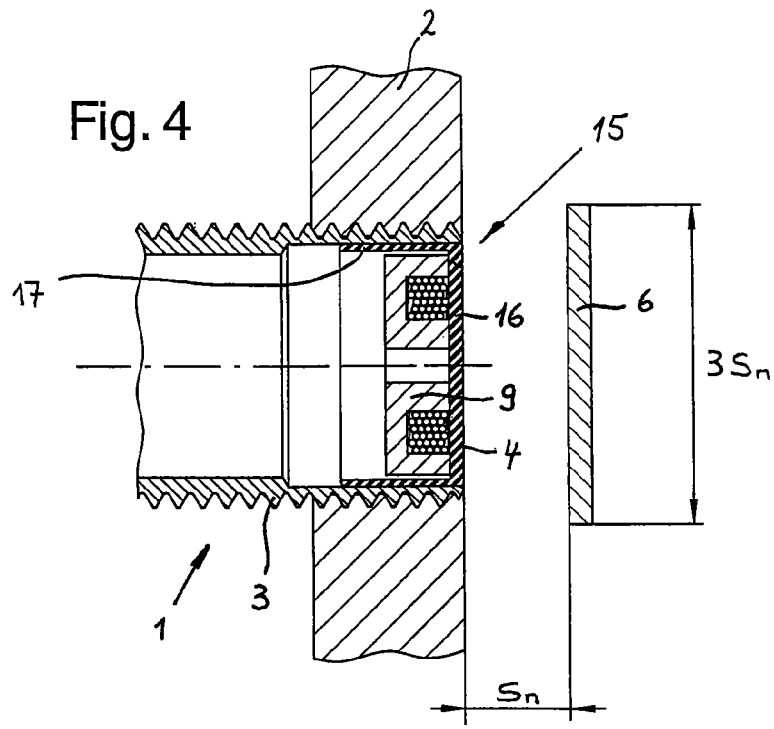
FIG. 4 shows an arrangement comprising a sensor, a mounting plate and a target defining the geometry of a model for FEM simulation.

FIG. 4 shows a sensor 1 embedded in a mounting plate 2. The enclosure of the sensor substantially consists of a cylindrical metal sleeve 3 with a thread on its outside. A front end of the sleeve 3 is closed by a plastic closure cap 15. The sensing face 4 at the front end of the enclosure is the outer surface of the bottom 16 of a plastic cap 15, which forms a front wall 16 of the enclosure. The sensing face 4 is flush with the front end of the sleeve 3. The open pot core 9 of the sensor coil 7 is arranged within the sleeve behind the front wall 16 and its open side is directed towards the sensing face 4, so that the magnetic field of the sensor coil 7 is directed towards the target 6 in front of the sensing face 4. In this example, the only electrically conducting element radially surrounding the core 9 within the space delimited by the outer surface of the enclosure is a front portion of the sleeve 3. This structure is used for sensors of different sizes, up to sleeve diameter M50 at least.

A method of appropriately adapting the conducting elements by means of FEM simulations will now be presented. The range of the embedded sensor is aligned with the range of the same sensor in its non-embedded state if, in an arrangement consisting of the sensor 1, a target 6 at the sensor's rated range $S_n$ in front of its sensing face 4 and a mounting plate 2 in which the sensor is embedded (as shown in FIG. 4 for example), the mounting plate 2 can be removed without affecting the total amount of eddy current losses. To verify if this condition is satisfied, the eddy current losses in the arrangement are determined using FEM simulations.

In the model for the simulation of this arrangement, each body in the magnetic circuit is specified by its geometry, permeability and electric resistivity. The standard target is a square mild steel plate which is 1 mm thick and the sides of which measure three times the sensor's rated range $S_n$. The specification of the geometry of the sleeve may be limited to a front portion of the sleeve and preferably includes the exact geometry of its thread to obtain exact results. Further parameters which need to be specified for the FEM simulation are the number of windings of the sensor coil, the operating frequency of the oscillator and the intensity of a (constant) coil current or a coil voltage and the coil resistance.

Based on this simulation model, the total amount of eddy current losses in the arrangement is numerically calculated by means of FEM simulation. The simulation is carried out for the arrangement including the mounting plate and for the same arrangement without the mounting plate and the difference in total eddy current loss is determined. If this difference is not close to zero, a property of a conducting element surrounding the core is slightly modified in its specification in the simulation model and the simulation is repeated in order to calculate again the difference in total eddy current loss between the situations with and without mounting plate. Since in this example the metal sleeve is the only conducting element surrounding the core, the property which is incrementally modified is preferably its electric resistivity. Observing the evolution of this difference due to the incremental changes made to the resistivity of the sleeve, this resistivity can be adjusted to a value at which the difference in total eddy current loss with and without mounting plate is close to zero.

This is the case when the total eddy current loss is the same with or without the mounting plate. In the electrical circuit, the total eddy current loss can be represented as an equivalent resistance in the parallel equivalent circuit of the sensor coil. From this point of view, the resistivity of the sleeve metal is adapted in such a way that the equivalent resistance perceived by the coil in the arrangements with and without the mounting plate are the same.

Figure 5:
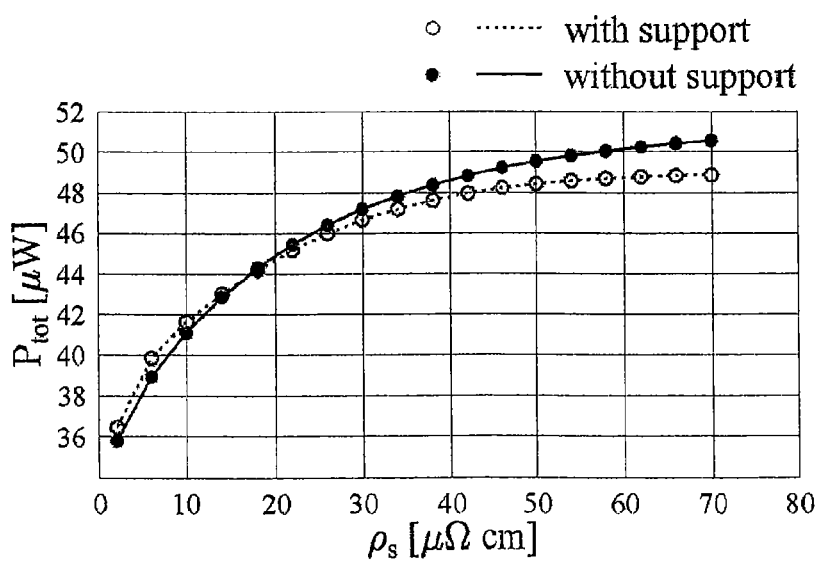
FIG. 5 shows diagram of the total eddy current loss calculated by Finite Element Method (FEM) simulation of a sensor with a geometry according to FIG. 4.

FIG. 5 shows a graphical representation of values of the total eddy current losses $P_{tot}$ calculated for an arrangement according to FIG. 4, with a sensor of size M8 having a rated range $S_n$ of 3 mm, for different values of the electrical resistivity $\rho_s$ of the sleeve 3 of the enclosure. The black dots represent the values for the non-embedded state (without the mounting plate) and the open circles represent the values for the embedded state (with the mounting plate) of the sensor. The power loss in the core is considered to be constant and small so that it merely represents an offset which has been omitted in order to simplify the calculation. There is an intersection of the graphs representing the total eddy current losses with and without the mounting plate. At the point of this intersection, the sleeve metal has an electrical resistivity of 18 $\|\Omega\cdot cm$. If a metal with this resistivity is used to form the sleeve of a sensor as specified in the model used for the simulation, its range when embedded in a mild steel mounting plate is perfectly aligned with its range in the non-embedded state.

This method of designing an inductive proximity sensor for embedding in a metal mounting plate has proven to be particularly useful for the design of long range sensors which are characterized by a reference threshold of 10 percent or less, or by a rated range exceeding the minimal range defined in formula (3) above.

Since the sleeve metal needs to be chosen for its electrical resistivity, this metal may not be of sufficient chemical inertness for some applications and a coating of the outer surface of the sleeve with a different metal such as chrome may be required. Such a coating represents an additional element of conducting material surrounding the core which needs to be specified in the FEM simulation model for the determination of the required resistivity of the sleeve.

If the front portion of an enclosure sleeve is the only conducting element surrounding the core of a sensor, besides a protective coating of a suitable material such as chrome which may be applied to the outer surface of the sleeve, the resistivity of the non-ferromagnetic sleeve metal required for alignment of the total eddy current losses with and without mounting plate is in a range between 15 μΩ·cm and 50 μΩ·cm. A typical metal of this type is an alloy containing copper, nickel and zinc.

These, as well as any other values of resistivity indicated in this document relate to the respective material at a temperature of 20° Celsius.

Figure 6:
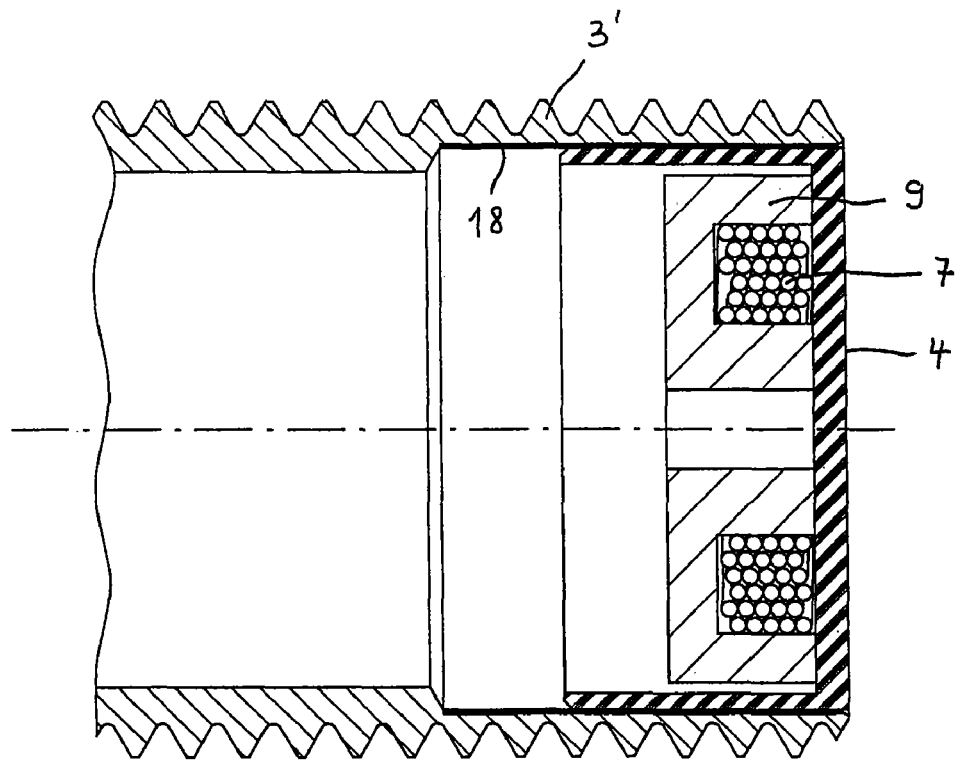
FIG. 6 shows at an enlarged scale the longitudinal sectional view of the front portion of an inductive proximity sensor.

FIG. 6 shows the front portion of another embodiment of an inductive proximity sensor. The sensor coil 7, its core 9 and the geometry of the enclosure comprising the metal sleeve 3 are identical to the ones of the sensor shown in FIG. 4, with the exception that a coating 18 is applied to the inner surface of the sleeve in a front portion of the same. The sleeve 3' consists of a non-ferromagnetic metal with an electrical resistivity which is higher than the value determined for perfect embeddability of the sensor according to the method described with reference to FIGS. 4 and 5 above. A sleeve made of stainless steel is preferably used for its chemical inertness. The excessive electrical resistivity of the sleeve can be compensated by applying the coating 18, which preferably consists of a non-ferromagnetic metal as well and the electrical resistivity of which is lower than the one of the metal of the sleeve.

Depending on the material, the geometry and the exact arrangement of the coating 18, the difference between the sensor ranges in the embedded and the non-embedded state is positive or negative and there is exactly one coating thickness at which this difference is zero. FEM simulation can be used as explained with reference to FIG. 4 above in order to determine this thickness. In this case, the properties which are preferably changed between individual simulation cycles are properties of the coating 18, namely its thickness or its electrical resistivity.

Regardless of the material of the sleeve, a coating thickness of 40 μm is considered to be a maximum for sensors of any usual size, up to M50 at least, if the electrical resistivity of the coating is below 15 μΩ·cm. Generally speaking: the thinner the coating, the lower the electrical resistivity of the coating material needs to be in order to align the ranges of the sensor in its embedded and non-embedded states. A coating thickness of 30 μm is considered to be a maximum if the electrical resistivity of the coating material is below 10 μΩ·cm (example: brass) and a coating thickness of 20 μm is considered to be a maximum if the electrical resistivity of the coating material is below 5 μΩ·cm (examples: copper, aluminum, gold). The actual thickness of the metal coating is below the applicable maximum values and needs to be determined based on the particularities of the respective sensor, preferably according to the method described with reference to FIG. 4 above.

It is worth noting that the approaches for the optimization of the embeddability of a proximity sensor according to the examples of FIG. 4 (without the metal coating 18) and FIG. 6 (with the metal coating 18) are based on the same physical principle: Electrically conducting elements surrounding the core of the sensor coil are adjusted so that the total amount of eddy current losses distributed amongst the target, the mounting plate and conducting elements of the sensor enclosure in the mounted state is equal to the eddy current losses incurred without the mounting plate in the non-embedded state. In particular, the metal coating 18 does not have the function of a shield. In fact, a metal coating effectively shielding the mounting plate from the sensor coil and core could not act as a means for adjusting the distribution of eddy current losses according to the invention. Therefore, the thickness of the metal coating 18 is preferably less than half the skin depth of the coating material at the operating frequency of the oscillator, and more preferably less than 30% of this skin depth. As mentioned before, this operating frequency is preferably above 50 kHz in order to ensure a sufficiently long operating distance of the sensor.

Figure 7:
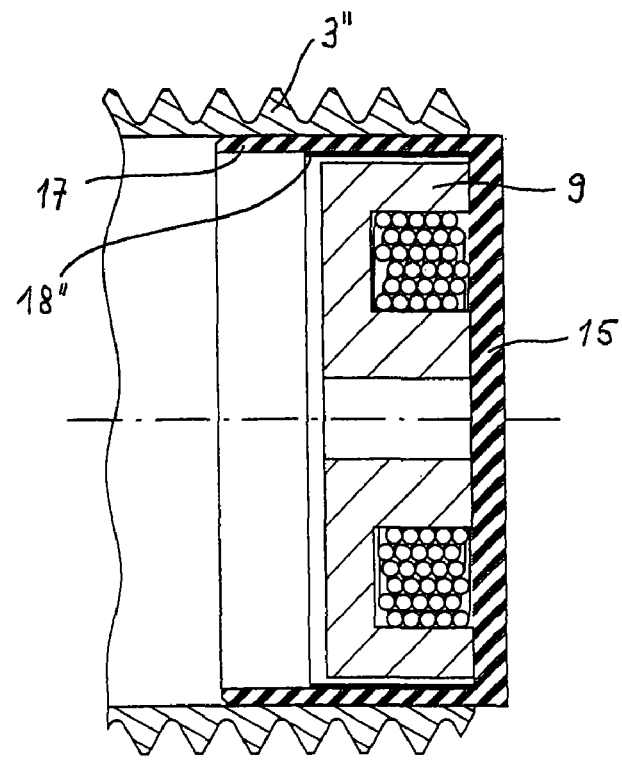
FIG. 7 shows the front portion of an alternative embodiment of the sensor according to FIG. 6.

FIG. 7 shows the front portion of a sensor which is similar to the one shown in FIG. 6. The main difference is that the metal coating 18" is not applied to the inner surface of the sleeve but rather to the inner surface of a circumferential wall 17 of the plastic cap 15, which extends into a gap between the sleeve 3" and the core 9. Another difference is that the plastic cap 15 slightly protrudes over the front end of the metal sleeve 3".

Many variations and modifications are possible within the spirit and scope of the invention.

Instead of the coating 18, 18", a thin metal film may be used.

The coating 18, 18" or film may be arranged in other positions, preferably somewhere between the core and the sleeve, including the possibilities to arrange the coating or film on the inner surface of the sleeve (as shown in FIG. 6) or on a radially outer surface of the core. The surface to which the coating or film (the thin metal layer) is applied, is preferably substantially cylindrical, but deviations from the cylindrical shape such as a cone shaped carrier surface, resulting in a conical shape of a metal coating deposited on this surface, are also possible.

Instead of the pot shaped core, an E-shaped core or a U-shaped core may be used. A common feature of these core shapes is that they are open on one side, so that they direct the magnetic field of the sensor coil mainly in one direction.

In embodiments according to FIG. 4 or 6, the cap 15 may be dispensed with and a synthetic resin may be used to close the sleeve 3 at its front end. In this case, a resin layer covering the core forms the front wall of the enclosure.

Instead of a threaded sleeve 3, a metal sleeve with a smooth outer surface may be used. The cross-sectional shape of the metal sleeve 3 is not necessarily circular. For instance, a metal sleeve of square-cylindrical outer shape may be used.

Finally, a synthetic enclosure may be used instead of the metal sleeve 3. In this case the core 9 is surrounded by a hollow cylindrical metal member arranged within the synthetic enclosure perpendicular to the sensing face 4. A ring shaped metal member is sufficient for the purpose of the invention and this metal member may be combined with a metal layer in the same way as described for the sleeve shaped metal member with reference to FIG. 6.

The invention claimed is:

1. An inductive proximity sensor for embedding in a metal mounting plate, comprising an enclosure with a front wall of synthetic material forming a sensing face at a front end of the enclosure, an oscillator comprising a sensor coil with a core consisting of a material with a relative magnetic permeability larger than 1, typically a ferrite, which is arranged within the enclosure behind the front wall so that an open side of the core is directed towards the sensing face in order to direct the magnetic field of the coil towards a target in front of the sensing face, a hollow cylindrical metal member arranged perpendicular to the sensing face and surrounding the core, and a measuring circuit for measuring an attenuation of the oscillator due to eddy currents, wherein the core is radially surrounded by a metal layer with an electrical resistivity of less than 15 μΩ·cm and with a thickness of less than 40 μm, wherein the measuring circuit is arranged to change an output signal of the sensor circuit as soon as the attenuation exceeds a predetermined reference threshold corresponding to an attenuation of 0.1 (10 percent) or less.

2. The proximity sensor according to claim 1, wherein the layer consists of non-ferromagnetic metal.

3. The proximity sensor according to claim 2, wherein the layer is arranged between the metal member and the core.

4. The proximity sensor according to claim 1, wherein the layer is arranged between the metal member and the core.

5. The proximity sensor according to claim 1, wherein the metal member is a metal sleeve and the core is arranged within this sleeve.

6. The proximity sensor according to claim 5, wherein the front wall is the bottom of a closure cap, a circumferential wall of the cap extends into a gap between the sleeve and the core and the layer is arranged on the inner surface of this wall.

7. The proximity sensor according to claim 1, wherein the layer is a metal coating.

8. The proximity sensor according to claim 1, wherein the thickness of the layer is less than half the skin depth of the layer material at the operating frequency of the oscillator, and preferably less than 30% of this skin depth.

9. The proximity sensor according to claim 1, wherein the thickness of the metal layer is adapted so that, for a mild steel target, the distance between the sensing face and the target at which the attenuation caused by eddy currents corresponds to the reference threshold in the embedded state of the sensor, differs from the same distance in the non-embedded state of the sensor by 30 percent at most and preferably by 20 percent at most.

10. A method of designing a proximity sensor according to claim 1, wherein, in an arrangement comprising the sensor and a mild steel target arranged at a fixed distance in front of the sensing face of the same, the attenuation of the oscillator is determined in the embedded state of the sensor and in the non-embedded state of the sensor, and if the determined attenuation is not the same in both states, then the thickness of the metal layer is adjusted by an increment, and these steps are repeated one or more times in order to determine a thickness of the layer at which the attenuation in the embedded state is substantially equal to the attenuation in the non-embedded state.

11. A method of designing a proximity sensor according to claim 1, wherein, in an arrangement comprising the sensor and a mild steel target arranged at a fixed distance in front of the sensing face of the same, the attenuation of the oscillator is determined in the embedded state of the sensor and in the non-embedded state of the sensor, and if the determined attenuation is not the same in both states, then the electrical resistivity of the metal member surrounding the core is adjusted by an increment, and these steps are repeated one or more times in order to determine an electrical resistivity of said metal member, at which the attenuation in the embedded state is substantially equal to the attenuation in the non-embedded state.

12. An inductive proximity sensor for embedding in a metal mounting plate, comprising an enclosure with a front wall of synthetic material forming a sensing face at a front end of the enclosure, an oscillator comprising a sensor coil with a core consisting of a material with a relative magnetic permeability larger than 1, typically a ferrite, which is arranged within the enclosure behind the front wall so that an open side of the core is directed towards the sensing face in order to direct the magnetic field of the coil towards a target in front of the sensing face, a hollow cylindrical metal member arranged perpendicular to the sensing face and surrounding the core, and a measuring circuit for measuring an attenuation of the oscillator due to eddy currents, characterized in that the metal member consists of a non-ferromagnetic metal with an electrical resistivity of 15 μ□cm to 50 μ□cm, wherein the measuring circuit is arranged to change an output signal of the sensor circuit as soon as the attenuation exceeds a predetermined reference threshold corresponding to an attenuation of 0.1 (10 percent) or less.

13. The proximity sensor according to claim 12, wherein the metal member is a metal sleeve and the core is arranged within this sleeve.

14. The proximity sensor according to claim 13, wherein the measuring circuit is arranged to change an output signal of the sensor circuit as soon as the attenuation exceeds a predetermined reference threshold corresponding to an attenuation of 10 percent or less.

15. The proximity sensor according to claim 14, wherein the measuring circuit is arranged to change an output signal of the sensor circuit as soon as the attenuation exceeds a predetermined reference threshold corresponding to an attenuation of 10 percent or less.

16. The proximity sensor according to claim 12, wherein the electrical resistivity of the sleeve portion surrounding the core is adapted so that, for a mild steel target, the distance between the sensing face and the target at which the attenuation caused by eddy currents corresponds to the reference threshold in the embedded state of the sensor, differs from the same distance in the non-embedded state of the sensor by 30 percent at most and preferably by 20 percent at most.

\* \* \* \* \*

UNITED STATES PATENT AND TRADEMARK OFFICE
CERTIFICATE OF CORRECTION

PATENT NO. : 8,179,124 B2
APPLICATION NO. : 12/499923
DATED : May 15, 2012
INVENTOR(S) : Marc De Huu et al.

It is certified that error appears in the above-identified patent and that said Letters Patent is hereby corrected as shown below:

IN THE CLAIMS:

Column 8, Claim 1, line 67 should read:
less than 15 μΩ·cm and with a thickness of less than 40 μm, Column 10, Claim 12, line 22 should read:
trical resistivity of 15 μΩ·cm to 50 μΩ·cm, wherein the mea- Signed and Sealed this
Second Day of October, 2012

David J. Kappos
*Director of the United States Patent and Trademark Office*